US010054375B2

United States Patent
David

(10) Patent No.: US 10,054,375 B2
(45) Date of Patent: Aug. 21, 2018

(54) SELF-ADJUSTING COOLING MODULE

(71) Applicant: Mellanox Technologies Ltd., Yokneam (IL)

(72) Inventor: Tom David, Haifa (IL)

(73) Assignee: Mellanox Technologies, Ltd., Yokneam (IL)

( * ) Notice: Subject to any disclaimer, the term of this patent is extended or adjusted under 35 U.S.C. 154(b) by 15 days.

(21) Appl. No.: 15/182,635

(22) Filed: Jun. 15, 2016

(65) Prior Publication Data

US 2017/0363371 A1    Dec. 21, 2017

(51) Int. Cl.
| | |
|---|---|
| *F28F 7/00* | (2006.01) |
| *F28F 5/00* | (2006.01) |
| *F28F 13/00* | (2006.01) |
| *H01L 23/367* | (2006.01) |
| *H01L 23/40* | (2006.01) |
| *F28D 21/00* | (2006.01) |

(52) U.S. Cl.
CPC .............. *F28F 5/00* (2013.01); *F28F 13/00* (2013.01); *H01L 23/3675* (2013.01); *H01L 23/40* (2013.01); *F28D 2021/0029* (2013.01); *F28F 2013/008* (2013.01); *F28F 2280/10* (2013.01)

(58) Field of Classification Search
CPC ........ H01L 23/40; H01L 23/3675; F28F 5/00; F28F 13/00; F28F 2013/008; F28F 2280/10; F28D 2021/0029
See application file for complete search history.

(56) References Cited

U.S. PATENT DOCUMENTS

| | | | | | |
|---|---|---|---|---|---|
| 3,972,012 A | * | 7/1976 | Liu | ......................... | H01P 1/005 257/719 |
| 4,639,829 A | * | 1/1987 | Ostergren | ........... | H01L 23/4006 165/185 |
| 4,908,695 A | * | 3/1990 | Morihara | ............ | H01L 23/4338 257/719 |

(Continued)

FOREIGN PATENT DOCUMENTS

| | | | | |
|---|---|---|---|---|
| EP | 2999320 A1 | * | 3/2016 | ......... H05K 7/20445 |
| JP | 2005322819 A | | 11/2005 | |

OTHER PUBLICATIONS

EP 2 999 320 A1 machine translation.*

(Continued)

*Primary Examiner* — Len Tran
*Assistant Examiner* — Gordon Jones
(74) *Attorney, Agent, or Firm* — D. Kligler IP Services Ltd.

(57) ABSTRACT

A cooling apparatus includes first and second wedges, a solid thermal interface material (TIM) and a flexible force-exerting element. The first wedge has a first flat surface and a first diagonal surface. The first flat surface is configured to dissipate heat from an electronic device. The second wedge has a second flat surface and a second diagonal surface. The second diagonal surface faces the first diagonal surface, and the second flat surface is coupled to a heat sink and configured to dissipate heat thereto. The TIM is disposed between the first and second diagonal surfaces, and is configured to transfer heat between the first and second wedges. The force-exerting element is configured to move the first wedge or the second wedge, so as to slide the first diagonal surface or the second diagonal surface on the TIM and push the second flat surface against the heat sink.

10 Claims, 2 Drawing Sheets

(56) References Cited

U.S. PATENT DOCUMENTS

| | | | |
|---|---|---|---|
| 5,028,989 A * | 7/1991 | Naganuma | H01L 23/4338 |
| | | | 165/104.33 |
| 5,471,850 A | 12/1995 | Cowans | |
| 7,009,284 B2 | 3/2006 | Nakase et al. | |
| 7,118,292 B2 | 10/2006 | Miao et al. | |
| 8,333,517 B2 | 12/2012 | Tanobe et al. | |
| 8,686,644 B2 | 4/2014 | Wootton | |
| 8,870,467 B2 | 10/2014 | Levy et al. | |
| 9,016,957 B2 | 4/2015 | Ben David et al. | |
| 9,329,349 B2 | 5/2016 | Ben David et al. | |
| 9,620,890 B1 * | 4/2017 | Vino, IV | H01R 13/533 |
| 2002/0175403 A1 * | 11/2002 | Sreeram | B23K 35/302 |
| | | | 257/702 |
| 2005/0068739 A1 * | 3/2005 | Arvelo | H01L 23/3675 |
| | | | 361/718 |
| 2005/0075573 A1 | 4/2005 | Park et al. | |
| 2005/0201098 A1 | 9/2005 | DiPenti et al. | |
| 2014/0284463 A1 | 9/2014 | Kuroda et al. | |

OTHER PUBLICATIONS

CN Application # 2014102609781 Office Action dated Sep. 20, 2016.
GE Plastics, "ULTEM.RTM. Polyetherimide Resins", Product Guide, 52 pages, 2003.

\* cited by examiner

SELF-ADJUSTING COOLING MODULE

FIELD OF THE INVENTION

The present invention relates generally to cooling of integrated circuits, and particularly to self-adjusting cooling modules for integrated circuits.

BACKGROUND OF THE INVENTION

Integrated circuits (ICs) and other electronic devices may produce excessive heat during operation. Various known types of cooling modules are designed to control the temperature of an electronic device by dissipating heat from the device to the environment via a heat sink.

For example, U.S. Pat. No. 4,908,695, whose disclosure is incorporated herein by reference, describes a heat conducting member placed in a space between a semiconductor chip which generates heat and a heat transfer block which is cooled by a coolant. The heat conducting member conducts heat from the semiconductor chip to the heat transfer block. The heat conducting member has a slanted surface which is inclined with respect to a surface to be cooled of the corresponding semiconductor chip.

U.S. Pat. No. 4,639,829, whose disclosure is incorporated herein by reference, describes a device that thermally couples a heat dissipating integrated circuit chip to the heat sink in a thermal conduction module for effective cooling of the chip by minimizing the thermal resistance path from the chip to the sink. The device is a combination of a heat conducting flat based, truncated solid conical disc which is spring loaded on the back of the chip and a heat conductive hat member having an opening with a continuous tapered wall to conformally fit over the truncated conical disc. The gap between the disc and the hat is packed with a thin layer of a high thermal conductivity grease to provide a low interfacial thermal resistance and mechanical flexibility between the disc and the hat.

SUMMARY OF THE INVENTION

An embodiment of the present invention that is described herein provides a cooling apparatus, including a first wedge, a second wedge, a solid thermal interface material (TIM) and a flexible force-exerting element. The first wedge has a first flat surface and a first diagonal surface. The first flat surface is coupled to an electronic device and is configured to dissipate heat therefrom. The second wedge has a second flat surface and a second diagonal surface. The second diagonal surface faces the first diagonal surface of the first wedge, and the second flat surface is coupled to a heat sink and configured to dissipate heat thereto. The solid TIM is disposed between the first and second diagonal surfaces and is configured to transfer heat between the first and second wedges. The flexible force-exerting element is configured to move the first wedge or the second wedge, so as to slide the first diagonal surface or the second diagonal surface on the TIM and push the second flat surface against the heat sink.

In some embodiments, the flexible force-exerting element includes one or more compression or leaf springs, which are coupled to the first wedge or to the second wedge. In other embodiments, the first and second wedges and the flexible force-exerting element are all made of a single integral piece of material. In yet other embodiments, the TIM is coupled to the first wedge or to the second wedge and the other of the first wedge or the second wedge is configured to slide on the TIM.

In an embodiment, the flexible force-exerting element includes a compressible thermal pad, which is configured to be compressed before being fitted into the cooling apparatus and to push the first wedge or the second wedge. In another embodiment, the thermal pad is configured to conduct heat from the electronic device to the first wedge or to the second wedge. In yet another embodiment, the thermal pad includes a sponge, which is configured to expand by the conducted heat.

In some embodiments, the flexible force-exerting element is configured to pull the first wedge or the second wedge using a tension spring.

There is further provided, in accordance with an embodiment of the present invention, a method for cooling an electronic device, including mounting between the electronic device and a heat sink a cooling apparatus, which includes a first wedge, a second wedge, a solid thermal interface material (TIM) and a flexible force-exerting element. The first wedge has a first flat surface and a first diagonal surface. The first flat surface is coupled to the electronic device. The second wedge has a second flat surface and a second diagonal surface. The second diagonal surface faces the first diagonal surface of the first wedge, and the second flat surface is coupled to the heat sink. The solid TIM disposed between the first and second diagonal surfaces. The flexible force-exerting element is configured for moving the first wedge or the second wedge, so as to slide the first diagonal surface or the second diagonal surface on the TIM and push the second flat surface against the heat sink. The electronic device is operated, and heat generated by the electronic device is conducted via the cooling apparatus to the heat sink.

There is additionally provided, in accordance with an embodiment of the present invention, a method for producing a cooling apparatus, including providing a first wedge having a first flat surface and a first diagonal surface, for coupling the first flat surface to an electronic device. A second wedge is provided, having a second flat surface and a second diagonal surface, and the second diagonal surface is positioned to face the first diagonal surface of the first wedge, for coupling the second flat surface to a heat sink. A solid thermal interface material (TIM) is disposed between the first and second diagonal surfaces. A flexible force-exerting element is coupled to at least the first wedge or the second wedge, so as to slide the first diagonal surface or the second diagonal surface on the TIM and to push the second flat surface against the heat sink.

The present invention will be more fully understood from the following detailed description of the embodiments thereof, taken together with the drawings in which:

DETAILED DESCRIPTION OF EMBODIMENTS

Overview

Figure 1:
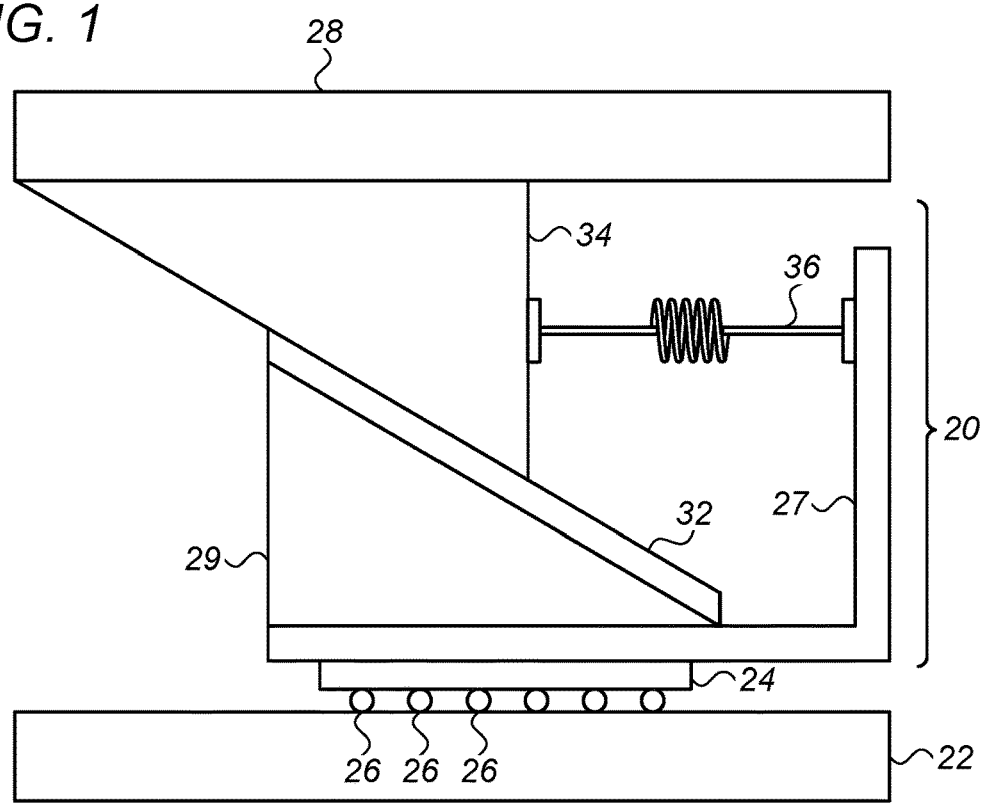
FIG. 1 is a schematic, side view of a cooling module located between an electronic device and a heat sink, in accordance with an embodiment of the present invention.

Electronic systems typically comprise one or more electronic devices such as integrated circuit (IC) devices. During operation, an electronic device may produce excessive heat that may cause the electronic device or other elements in the system to malfunction or even to become damaged. It is therefore important to dissipate the heat away to the environment, typically using a heat sink. For best performance, the heat sink should be in direct contact with the electronic device. Sometimes, however, direct contact is not possible, and a gap remains between the electronic device and the heat sink. The size and shape of the air gap may vary due to design constraints and production tolerances of the electronic system.

Embodiments of the present invention that are described hereinbelow provide improved techniques for conducting heat produced by an electronic device using a cooling module, which is fitted between the electronic device and a heat sink. The cooling module creates a low-thermal-resistance path, while adapting to the variations of the gap formed between the electronic device and the heat sink. In some embodiments, the cooling module comprises first and second wedges, each having a flat surface and a diagonal surface. The diagonal surfaces of the first and second heat-conducting wedges are facing one another so that the flat surfaces of the first and second wedges are coupled to the electronic device and the heat sink, respectively.

In some embodiments, a heat-conducting thermal interface material (TIM) is disposed between the diagonal surfaces of the wedges and is configured to transfer heat between the two wedges. One or more flexible force-exerting elements, e.g., springs, are coupled to at least one of the wedges and configured to move the other wedge so that at least one diagonal surface slides on the TIM. This arrangement modifies the height of the cooling module and constantly push the flat surfaces so as to make firm physical contact with the electronic device and the heat sink simultaneously, thus enabling heat flow from the electronic device to the heat sink.

The flexible element may comprise a compression spring that pushes (or a tension spring that pulls) one of the wedges to slide along the TIM that is disposed on the diagonal surface of the other wedge. In some embodiments, the compression spring may have a helical shape, an S-shape or any other suitable shape. In alternative embodiments, the flexible element may be a leaf spring, which is configured to push the relevant wedge along the diagonal surface and the TIM. In an embodiment, the cooling module may be assembled from multiple parts (e.g., two wedges, a spring and a wall to support the spring). In an alternative embodiment, the entire module may be fabricated as a single integral piece of material, e.g., by molding the parts together.

The disclosed techniques are particularly useful in complex electronic assemblies having large mechanical tolerances, resulting in a wide range of possible air gaps between each electronic device and its heat sink. The disclosed techniques are able to further compensate for variations in gap size over time (e.g., due to temperature changes or aging of the assembly).

System Description

FIG. 1 is a schematic, side view of a cooling module 20 located in a gap between an electronic device 24 and a heat sink 28, in accordance with an embodiment of the present invention. Device 24 may comprise any suitable type of electronic device, such as an Integrated Circuit (IC), a processor, a memory device, a micro electro-mechanical system (MEMS) device, a power device or a silicon photonics devices. Device 24 may be assembled on a substrate 22, such as a printed circuit board (PCB), and electrically connected to the PCB via electrical contacts such as a ball grid array (BGA) 26 or any other suitable contacts known in the art. Device 24 produces heat during operation, and module 20 is configured to conduct some of the heat away from device 24 to a heat sink 28.

In some cases, the gap between device 24 and heat sink 28 may vary by design (e.g., due to application-related thickness variation of device 24) or due to manufacturing tolerances (e.g., dimensions of heat sink 28 and/or the packaging of device 24). Furthermore, the gap may vary within a given assembly over time, for example due to thermal cycles or aging of the assembly. Module 20 is configured to fill the gap and make firm physical and thermal contact with both device 24 and heat sink 28, so as to conduct heat well from device 24 to heat sink 28, regardless of such variations.

In some embodiments, module 20 comprises a wall 27, which may by connected to a wedge 29. In alternative embodiments, wall 27 and wedge 29 may be fabricated from a single integral piece of material. Wedge 29 has a flat surface which is coupled to device 24 located below a flat (horizontal) surface of wall 27, and a diagonal surface. The flat surface of wedge 29 is larger than the top surface of device 24 so as to guarantee heat dissipation from the entire surface of the electronic device.

In some embodiments, a thermal interface material (TIM) 32 is disposed on the diagonal surface of wedge 29. The TIM is typically fabricated from heat-conducting materials such as phase change material (PCM) or silicon based materials in the form of a thermal paste, gel or pad and is configured to improve the heat dissipation from wedge 29.

In an embodiment, flexible elements such as one or more compression springs 36 are coupled to wall 27 on one end and to a wedge 34 on another end. Wedges 29 and 34 are typically fabricated from heat conducting materials such as copper or aluminum. Wedge 34 comprises a diagonal surface facing TIM 32 and a flat surface facing heat sink 28. Two flexible force-exerting elements, in the present example springs 36, are configured to push wedge 34 to slide along the surface of TIM 32 so that the flat surface of wedge 34 makes contact with heat sink 28. In another embodiment, wedge 34 and heat sink 28 may be fabricated from a single integral piece of material so that springs 36 may push wedge 34 together with heat sink 28.

In alternative embodiments, TIM 32 may be disposed on the diagonal surface of wedge 34, so that TIM 32 may slide on the diagonal surface of wedge 29 while springs 36 push wedge 34.

The thermal resistance of a given element is measured in units of degrees per watt and provided by equation (1):

$$R = \frac{1}{K \cdot A} \tag{1}$$

where R is the thermal resistance,
l is the thickness of the element,
K is the thermal conductivity of the material,
and A is the sectional area of the element.

The diagonal surfaces of wedges 29 and 34 increase the sectional area (A) used for heat dissipation, and therefore reduce the heat resistivity so as to enable fast and efficient cooling of device 24. Furthermore, using diagonal surfaces enables the cooling module to fit in a variety of gap sizes between device 24 and heat sink 28.

In an example embodiment, module 20 may be 5 mm wide and 5 mm long to cover a wide range of electronic devices, but any other suitable width and length are applicable. In the example of FIG. 1, module 20 is configured to fit in a range of air gaps between 2.6 mm and 3.8 mm by sliding wedge 34 down or up accordingly, yet, the size and shape of module 20 (and its respective elements) may be configured to fit gaps of any shape and size between device 24 and heat sink 28.

In an embodiment, springs 36 may apply a constant force along the travel of the wedge. In alternative embodiments, the springs may apply variable force. Furthermore, in yet other embodiments, springs 36 may apply tension force (rather than compression force) using an alternative design of the wedges, such as using an inverse slope of the wedges so that the springs pull (rather than push) the wedge up to slide along the slope of the diagonal surface.

Figure 2:
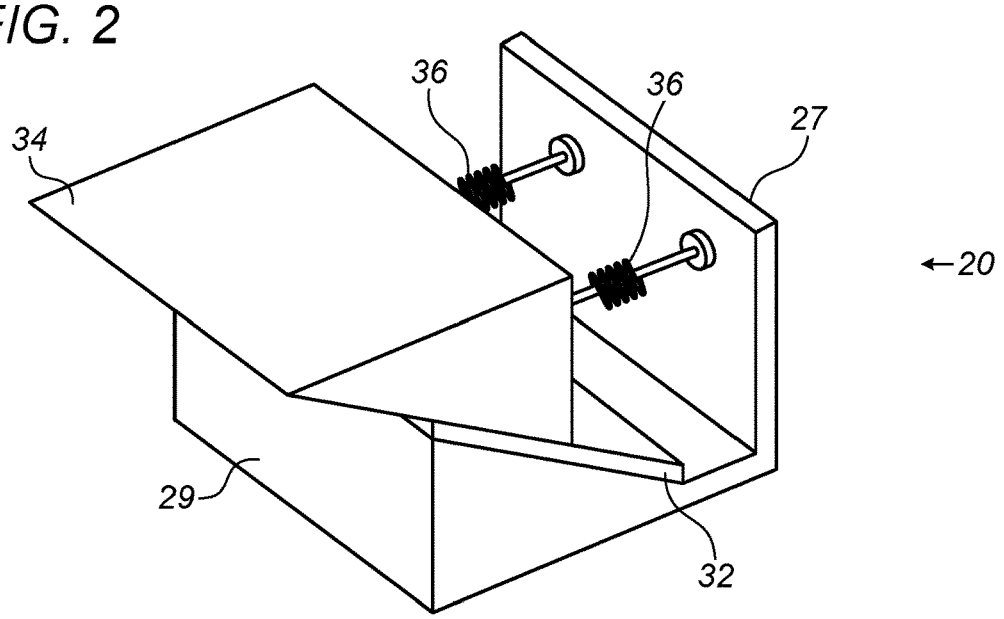
FIG. 2 is a schematic, pictorial illustration of the cooling module of FIG. 1, in accordance with an embodiment of the present invention.

FIG. 2 is a schematic, pictorial illustration of cooling module 20, in accordance with an embodiment of the present invention. In the example of FIGS. 1 and 2, module 20 comprises two blocks (referred to as first and second blocks) that slide relative to one another (using springs 36) so as to fill the gap between device 24 and heat sink 28 shown in FIG. 1. The first block comprises wall 27, wedge 29 and TIM 32, and the second block comprises wedge 34. Springs 36 push the blocks relative to one another so as to fill the gap between device 24 and heat sink 28.

In alternative embodiments, the flat surface of wedge 34 may be coupled to heat sink 28 so that springs 36 may push the first block to slide down along the diagonal surface of wedge 29 so that the flat surface of wedge 29 fills the gap by touching device 24. In yet other embodiments, wall 27 and wedge 34 may be coupled into a single block (e.g., made from a single integral piece of material) while wedge 29 is comprised in a separate block, which is coupled to wall 27 only by springs 36. In this arrangement, wedge 29 slides down along the diagonal surface of wedge 34 (or along TIM 32) so as to fill the gap by being pressed toward device 24. Furthermore, in this arrangement the flat surface of wedge 29 is typically substantially larger than the upper surface of device 24 and the location of wedges is aligned with respect to device 24 so as to guarantee that wedge 29 completely covers the upper surface of device 24.

Without limiting to a specific arrangement of blocks, e.g., as described above, TIM 32 may be disposed on wedge 29 or, alternatively, on wedge 34. The specific arrangements shown in FIGS. 1 and 2 as well as the alternative arrangements described above are depicted purely by way of example. In other embodiments, those having ordinary skill in the art will be able to adapt the description in FIGS. 1 and 2, mutatis mutandis, for other suitable arrangements of coupling the wedges to wall 27, to springs 36 and to one or more TIMs 32 so as to fit in the gap between device 24 and heat sink 28.

Figure 3:
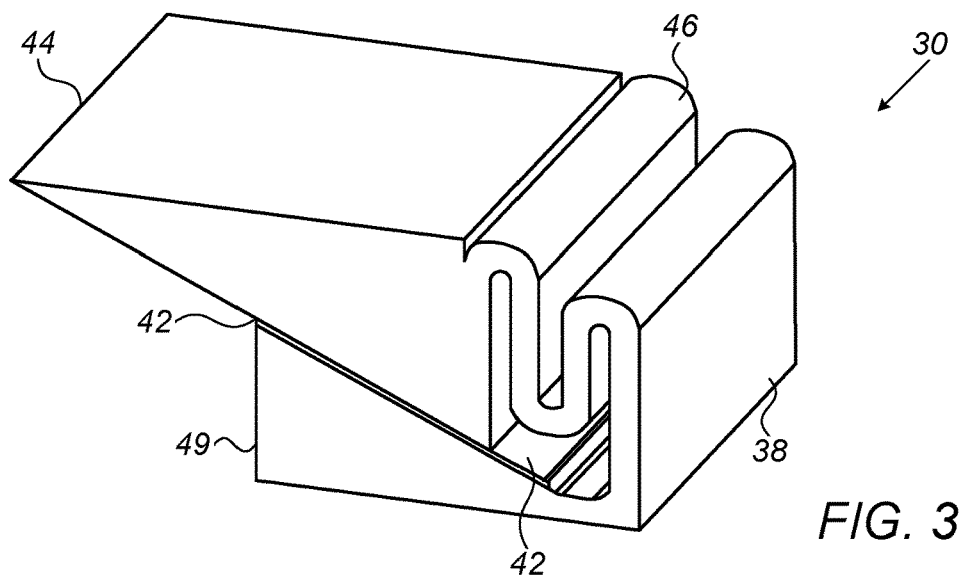
FIGS. 3-5 are schematic, pictorial illustrations of cooling modules, in accordance with other embodiments of the present invention.

FIG. 3 is a schematic, pictorial illustration of a cooling module 30, in accordance with another embodiment of the present invention. In this embodiment, module 30 is fabricated from a single integral piece of material, also referred to as a single block, having multiple regions that function as the first wedge, the second wedge and the flexible force-exerting elements.

Module 30 may be placed, for example, between device 24 and heat sink 28 in FIG. 1, instead of module 20. Some of the regions of module 30 correspond to respective elements describes in FIGS. 1 and 2. For example, wedges 44 and 49 correspond respectively to wedges 34 and 29, a wall 38 corresponds to wall 27 and TIM 42 corresponds to TIM 32. In an this embodiment, the flexible force-exerting element of module 30 comprises one or more springs 46 that differ from springs 36 by being coupled to wall 38 and to wedge 44 so that all these elements are comprised in a single block (e.g., fabricated from a single integral piece of material). As a single piece of material, module 30 may be fabricated using any suitable production technique, such as extrusion molding, machining, or three-dimensional (3D) printing.

In some embodiments, the flat surface of wedge 49 may be coupled to the top surface of device 24 shown in FIG. 1. In this arrangement, compression spring 46 pushes wedge 44 to slide along the diagonal surface so as to fill the gap between device 24 and heat sink 28 shown in FIG. 1.

Spring 46 is designed to operate with a compression load, i.e., the spring gets shorter as higher load is applied to it (e.g., in case of a narrow gap between heat sink 28 and device 24). Spring 46 may comprise any suitable form of a leaf spring such as S-shape, sinusoidal or multiple peaks and valleys. In the multiple peaks and valleys arrangement, the peaks may be lower near wall 38 and may gradually become higher toward wedge 44 so as to compensate for the height difference between the flat surface of wedge 44 and the top surface of wall 38.

In the example of FIG. 3, a single spring 46 comprises a low peak coupled to wall 38 at the right side, a high peak coupled to wedge 44 at the left side, and a valley located between the peaks. The thick structure of spring 46 compared to spring 36, and the single-block arrangement having no mechanical interfaces between different parts, further improve the heat conductance because the surface of spring 46 contributes to the thermal path between device and heat sink 28, thereby allowing efficient heat dissipation through spring 46 in addition to the thermal path between wedges 44 and 49. Furthermore, the single-block form of module 30 may simplify the assembly of block 30 between device 24 and heat sink 28. Module 30 may generally be more reliable than module 20 because it has less moving parts that can get misaligned.

In alternative embodiments, module 30 may be fabricated from multiple parts (e.g., blocks) using a similar arrangement as depicted for module 20 in FIG. 2.

Figure 4:
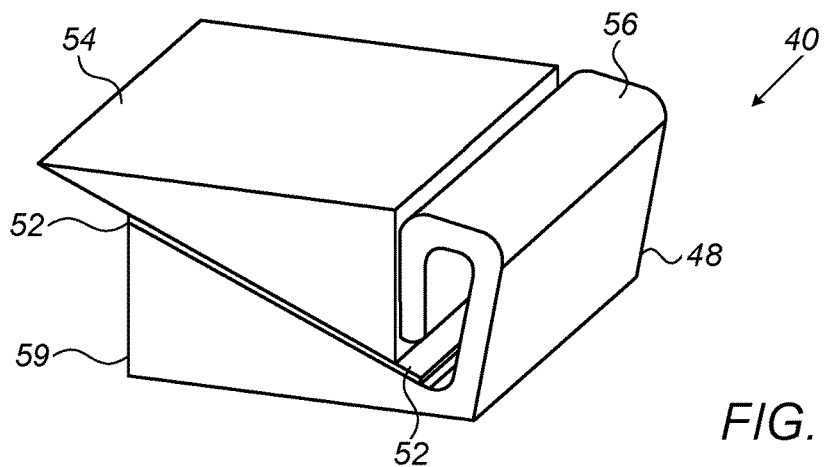

FIG. 4 is a schematic, pictorial illustration of a cooling module 40, in accordance with another embodiment of the present invention. Module 40 may replace, for example, module 20 of FIG. 1 above. In some embodiments, module 40 comprises wedges 54 and 59 that correspond to respective wedges 44 and 49, in FIG. 3. Similarly, a wall 48 corresponds to wall 38 and TIM 52 corresponds to TIM 42.

In this embodiment, the flexible force-exerting element comprises one or more leaf springs 56. The springs comprise wall 48 and are coupled to wedge 54 at one end, and to wedge 59 at the other end. In another embodiment, module 40 may comprise all the elements described above in a single block, for example by having the wedges and springs 56 in a single mold. In an alternative embodiment, wedge 54 may be formed as a separate part that is pushed by spring along the diagonal surface so as to be mechanically coupled to heat sink 28 shown in FIG. 1.

Figure 5:
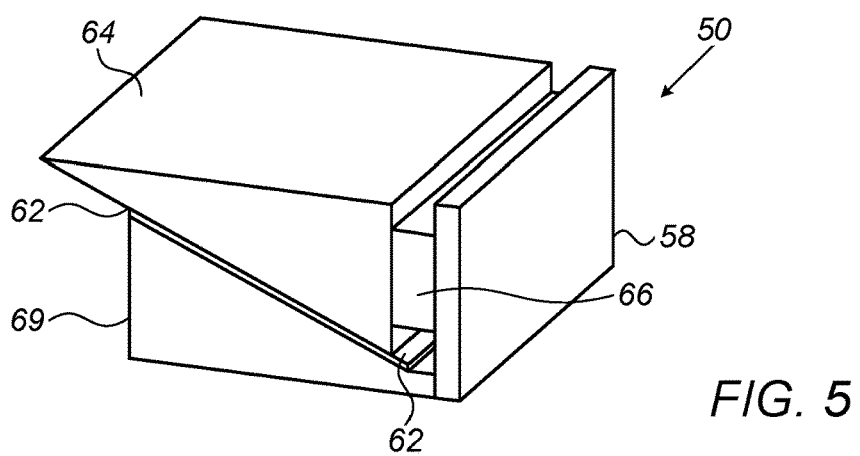

FIG. 5 is a schematic, pictorial illustration of a cooling module 50, in accordance with another embodiment of the present invention. Module 50 may replace, for example, module 20 of FIG. 1 above. In some embodiments, module 50 comprises wedges 64 and 69, a TIM 62 and a wall 58, which are similar to wedges 44 and 49, TIM 42 and wall 38 of FIG. 3, respectively. In the present example, the flexible force-exerting element of module 50 comprises a compressible thermal pad 66 that is mechanically compressed and fitted between wall 58 and wedge 64. Compressed pad 66 pushes wedge 64 away from wall 58. By virtue of the diagonal surfaces of the wedges, wedge 64 is pushed upwards against heat sink 28 (not shown in this figure). In an embodiment, pad 66 may comprise a sponge bulk glued between two plates (not shown).

In the example of FIG. 5, the right-hand-side plate of pad 66 may be glued to (or pressed against) wall 58 and the left-hand-side plate may be similarly coupled to wedge 64. Pad 66 may mechanically expand so as to serve as a spring that pushes wedge 64 against heat sink 28 shown in FIG. 1. Additionally or alternatively, the heat produced by device 24 may be transferred, via wedge 69 and wall 58, into pad 66 thus causing further expansion of the pad, which results in tighter coupling between wedge 64 and the heat sink. In some embodiments, pad 66 may comprise heat-conducting materials that may improve the overall rate of heat dissipation from device 24 to heat sink 28.

The cooling module configurations shown in FIGS. 1-5 above are depicted purely by way of example. In alternative embodiments, a cooling module may have any other suitable configuration, e.g., any other suitable wedges and flexible force-exerting elements. Furthermore, any of the cooling modules of FIGS. 3-5 (e.g., modules 30, 40 and 50) can be made of a single piece of material as depicted in FIG. 3, or of multiple parts as depicted in FIG. 1.

Although the embodiments described herein mainly address applications such as interconnect cables and similar microelectronic mechanical systems (MEMS), the methods and systems described herein can also be used in other products and applications, such as in water cooled switches and servers, or testing jigs in which the cooling device is separated from the product.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A cooling apparatus, comprising:
   a first wedge having a first flat surface and a first diagonal surface, wherein the first flat surface is coupled to an electronic device and configured to dissipate heat therefrom;
   a second wedge having a second flat surface and a second diagonal surface, wherein the second diagonal surface faces the first diagonal surface of the first wedge, and the second flat surface is coupled to a heat sink and configured to dissipate heat thereto;
   a solid thermal interface material (TIM) disposed between the first and second diagonal surfaces and configured to transfer heat between the first and second wedges; and
   a thermal pad, which is coupled to the second wedge and is configured to modify a height of the cooling apparatus to compensate for variations in a gap between the electronic device and the heat sink, by moving the second wedge and sliding the second diagonal surface on the TIM so as to push the second flat surface against the heat sink.

2. The cooling apparatus according to claim 1, wherein the TIM is coupled to the first wedge or to the second wedge and wherein the other of the first wedge or the second wedge is configured to slide on the TIM.

3. The cooling apparatus according to claim 1, wherein the thermal pad is compressible and is configured to be compressed before being fitted into the cooling apparatus.

4. The cooling apparatus according to claim 1, wherein the thermal pad is configured to conduct heat from the electronic device to the second wedge.

5. The cooling apparatus according to claim 4, wherein the thermal pad comprises a sponge, which is configured to expand by the conducted heat.

6. A method for cooling an electronic device, the method comprising:
   mounting between the electronic device and a heat sink a cooling apparatus, which comprises:
      a first wedge having a first flat surface and a first diagonal surface, wherein the first flat surface is coupled to an electronic device and configured to dissipate heat therefrom;
      a second wedge having a second flat surface and a second diagonal surface, wherein the second diagonal surface faces the first diagonal surface of the first wedge, and the second flat surface is coupled to the heat sink;
      a solid thermal interface material (TIM) disposed between the first and second diagonal surfaces; and
      a thermal pad, which is coupled to the second wedge and is configured to modify a height of the cooling apparatus to compensate for variations in a gap between the electronic device and the heat sink, by moving the second wedge and sliding the second diagonal surface on the TIM so as to push the second flat surface against the heat sink;
   operating the electronic device; and
   conducting heat generated by the electronic device via the cooling apparatus to the heat sink.

7. The method according to claim 6, wherein conducting the heat comprises conducting part of the heat from the electronic device, via the thermal pad, to the second wedge.

8. A method for producing a cooling apparatus, the method comprising:
   providing a first wedge having a first flat surface and a first diagonal surface, for coupling the first flat surface to an electronic device;
   providing a second wedge having a second flat surface and a second diagonal surface, and positioning the second diagonal surface to face the first diagonal surface of the first wedge, for coupling the second flat surface to a heat sink;
   disposing a solid thermal interface material (TIM) between the first and second diagonal surfaces; and
   coupling a thermal pad to the second wedge, for modifying a height of the cooling apparatus to compensate for variations in a gap between the electronic device and the heat sink, by moving the second wedge and sliding the second diagonal surface on the TIM so as to push the second flat surface against the heat sink.

9. The method according to claim 8, wherein disposing the TIM comprises coupling the TIM to the first wedge or to the second wedge.

10. The method according to claim 8, wherein coupling the thermal pad comprises compressing the thermal pad and fitting the thermal pad into the cooling apparatus.

\* \* \* \* \*